United States Patent [19]
Kuijk et al.

[11] Patent Number: 5,798,520
[45] Date of Patent: Aug. 25, 1998

[54] CELL FOR OPTICAL-TO-ELECTRICAL SIGNAL CONVERSION AND AMPLIFICATION, AND OPERATION METHOD THEREOF

[75] Inventors: Maarten Kuijk, Berchem; Paul Heremans, Leuven; Gustaaf Borghs, Kessel-Lo; Roger Vounckx, Schaarbeek, all of Belgium

[73] Assignee: IMEC vzw, Leuven, Belgium

[21] Appl. No.: 774,522

[22] Filed: Dec. 30, 1996

Related U.S. Application Data

[63] Continuation-in-part of Ser. No. 692,919, Jul. 31, 1996, abandoned.

[51] Int. Cl.[6] .............................. H01J 31/50; H04B 10/00
[52] U.S. Cl. .................... 250/214 A; 327/514; 359/152; 377/102
[58] Field of Search .................... 250/214 A, 551; 321/514; 330/59; 359/127, 152; 377/102

[56] References Cited

U.S. PATENT DOCUMENTS

| | | |
|---|---|---|
| 4,271,536 | 6/1981 | Copeland ............................ 359/152 |
| 4,864,168 | 9/1989 | Kasahara et al. ..................... 327/514 |
| 4,999,688 | 3/1991 | Hara et al. ........................... 359/108 |
| 5,059,788 | 10/1991 | Tashiro et al. ...................... 377/102 |
| 5,384,651 | 1/1995 | Van de Voore et al. ............. 359/152 |
| 5,448,056 | 9/1995 | Tsuruta ............................. 250/214 A |
| 5,448,390 | 9/1995 | Tsuchiya et al. ..................... 359/152 |
| 5,561,288 | 10/1996 | Stevens ........................... 250/214 A |
| 5,646,760 | 7/1997 | Kujik et al. ......................... 359/152 |

*Primary Examiner*—Stephone B. Allen
*Attorney, Agent, or Firm*—McDonnell Boehnen Hulbert & Berghoff

[57] ABSTRACT

An optoelectronic cell structure includes a plurality of pnpn-devices and circuitry for driving these pnpn-devices. The anodes or the cathodes of said pnpn-devices tied together form a competition node allowing differential charge amplification to take place. The unconnected electrode of each of the pnpn-devices is driven by a pair of complementary transistors. Light input on the pnpn-devices is converted into charge carriers. A forward bias amplifies the difference in charge content in the pnpn-devices by differential competition. A reverse bias turns off each pnpn-device at its own pace, the turn-off times rendering an estimate of the charge content in each pnpn-device present before turn-off. The total system forms a sensitive optical receiver for use in optical interconnects between two or more locations.

36 Claims, 9 Drawing Sheets

CELL FOR OPTICAL-TO-ELECTRICAL SIGNAL CONVERSION AND AMPLIFICATION, AND OPERATION METHOD THEREOF

This application is a continuation in part of application Ser. No. 08/692,919, now abandoned, filed Jul. 31, 1996, by the above named inventors, entitled Cell For Optical-To-Electrical Signal Conversion And Amplification, And Operation Method Thereof.

BACKGROUND OF THE INVENTION

It is known in the art that the parallel connection of two pnpn devices in series connected with a resistance is a system exhibiting differential operation. Said system is called a differential pair of pnpn-devices. Such a system is described in U.S. Pat. No. 4,999,688 issued to Hara et al. FIG. 1 shows the structural interconnection of the pnpn devices. Light incident on the two pnpn devices acts as an input. In response to an applied voltage, one of the two thyristors will switch on, and generate light. Depending on which element is on, the output is considered as a one or a zero. A disadvantage of this system is that only a digital output can be obtained. Another disadvantage of this system is that it is an optical-input-to-optical-output system only, with the restoration energy and clocking information delivered by voltage pulses. In order to allow for easy integration with VLSI-circuitry, an optical-to-electrical conversion is required.

FIELD OF THE INVENTION

The present invention relates to optoelectronic devices. More in particular, an optoelectronic cell for light conversion and amplification, comprising a plurality of pnpn-devices and driving circuitry is disclosed. A method of operating the optoelectronic cell such that differential amplification of light input is achieved together with electronic readout is further disclosed.

SUMMARY OF THE INVENTION

It is a first object of the invention to provide a novel method for differential charge amplification in a structure containing a plurality of pnpn-devices by the use of a competition node, instead of by parallel connection of pnpn-devices in series with a resistor.

A second object of the invention is to provide a method to measure the charge content in each of the pnpn-devices at a given time by turning the devices off individually while measuring their respective turn-off times. The turn-off times are analog values proportional to the charge content present in the device prior to turn-off.

A third object of the invention is to provide a method to render the pnpn-devices light sensitive after the turn-off process, by a voltage reset action.

A fourth object of the invention is to provide a means to operate the pnpn-devices from a single voltage supply.

Another object of the invention is to provide a latching comparator with two light inputs, an electrical clocking input, two complementary digital electrical outputs and a pulsed output where the pulse width is a measure for the amplitude of the received difference in light input. This pulse width also gives an indication of the error probability of the received bit. A short pulse width corresponds to a weak differential light input signal, or it indicates that the light inputs are poorly positioned with respect to the clock. A long pulse width corresponds to a clear differential light input signal with low error probability.

In brief, the structure which allows essentially all of these objects to be reached comprises the following elements: a plurality of circuits, each of said circuits including: a device with S-shaped current-voltage characteristics and having a first and a second terminal; means for applying an injection current and an extraction current on said device, said means being connected to said first terminal of said device; and essentially each of said circuits being connected at a competition node connecting essentially each of said second terminals of the devices.

In one preferred embodiment a plurality of pnpn-devices is connected together at one side forming a competition node; the other electrodes of the pnpn-devices each are driven by at least a couple of transistors for current injection and current extraction; at least one transistor of each couple is used to fix the voltages at the corresponding electrode. The electrodes that are not connected to said competition node also are probed to measure during turn-off the charge content of the pnpn-devices; the competition node is connected to at least one transistor, which preferably operates as a current source; a reset switch is preferably configured in parallel with each pnpn-device to reset the voltage across the pnpn-devices to a lower voltage, rendering them light sensitive.

The invention also includes structure for providing a relative measurement of the charge content of the pnpn devices, and for providing a signal indicative of which pnpn device contained the highest charge content. The structure comprises essentially an exclusive-or gate which outputs a logical one value when the voltages on the cathodes are different from each other, or when the difference is above a predetermined threshold. Additionally, a flip-flop structure is disclosed that is used to determine which pnpn device contained the highest charge content, and that provides a latch for storage of the determination.

The above and further objects and features of the invention will more fully be apparent from the following detailed description with accompanying drawings. A complete system is described with sufficient details to allow a person skilled in the art to fabricate a very sensitive differential light receiver in which the light-generated charges are differentially amplified and read-out electrically. Other embodiments of this invention, or a similar embodiment with other specific parameter settings, will be obvious to those skilled in the art, the spirit and scope of this invention being limited only by the appended claims.

BRIEF DESCRIPTION OF THE DRAWINGS

FIG. 9: Clock-generation part of the example in FIG. 8. From the external clock, three clocking signals are derived: CLX, CLY, and CLZ.

FIG. 10: The pnpn-devices and the driving transistors of the FIG. 8 example. The clocking signals from FIG. 9 are used.

FIG. 11: The flip-flop part of the example in FIG. 8.

DETAILED DESCRIPTION OF THE INVENTION

The detailed description will describe only two pnpn-devices to keep the drawings legible. The system of the present invention is capable of integrating three or more pnpn-devices. An example of such pnpn-device structures is given in the patent application PCT/BE93/00074, the teaching of which is incorporated herein by reference.

Similarly and for the sake of understandability, the description of the invention is explained in the particular case where the competition node is formed by connecting the anodes of the pnpn-devices together. A person skilled in the art can easily create the complement where the competition node is formed by connecting the cathodes together.

Figure 1:
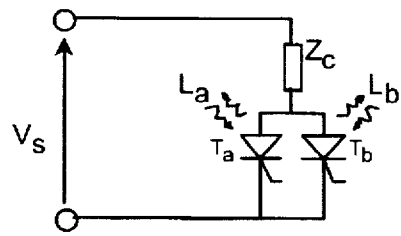
FIG. 1: Differential pair of pnpn-devices: Two pnpn-devices in parallel, placed in series with a resistance (Prior art).
Figure 2:
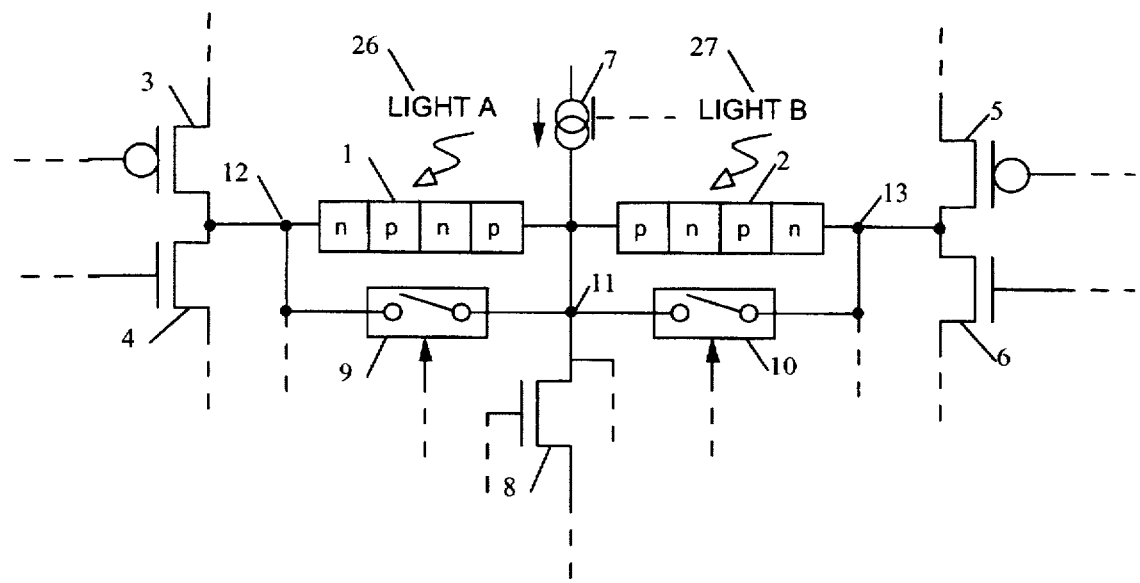
FIG. 2: A preferred embodiment of the optoelectronic cell structure according to the present invention.

FIG. 2 shows a preferred embodiment. Pnpn-device 1 and pnpn-device 2 are connected together at their anodes. The connection forms the competition node 11. The competition node 11 and the cathodes 12 and 13 are driven by transistors, as will be fully explained in the following text. In an embodiment of the present invention the pnpn-devices and the transistors can be fabricated in various technologies. Said pnpn-devices by preference are fabricated in a III–V technology and said transistors in a Si-technology, by preference a CMOS or a BICMOS technology. Said devices and said transistors are then interconnected by means of bonding or other techniques known to the person skilled in the art. The teaching of U.S. patent application Ser. No. 08/420,608, now U.S. Pat. No. 5,646,760, entitled, A Differential Pair Of Optical Thyristors Used As An Optoelectronic Transceiver, is incorporated herein by reference.

FIGS. 8 to 12 show a detailed example where this preferred embodiment with a single voltage supply is used in an optical receiver which acts as a hybrid latched comparator set-up with differential light input, an electrical clock, complementary digital outputs and a pulse with a width which is proportional to the amplitude of the differential light input or—in optical receiver terms—inverse-proportional to the error probability of the received bit.

Several actions can be exercised on the couple of pnpn-devices in this preferred embodiment. The following three actions (including the required means) will be explained in full detail: differential charge amplification, turn-off readout, and voltage-reset.

Differential Charge Amplification

Figure 10:
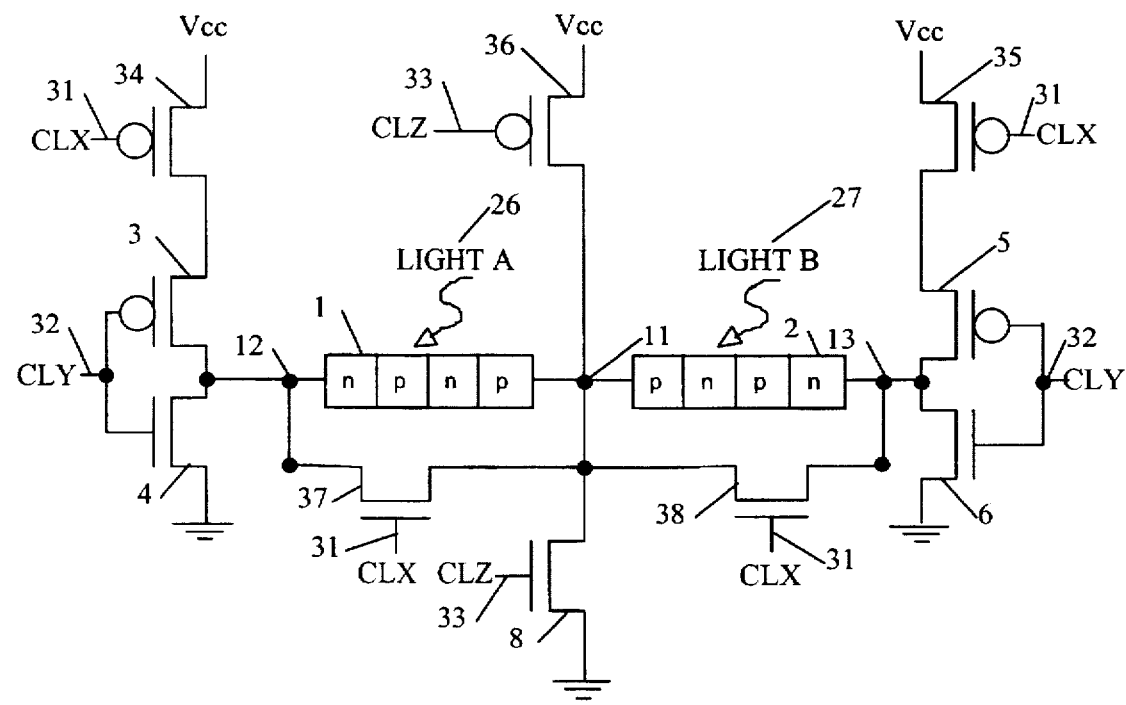

The differential charge amplification is obtained in the following manner. The cathodes 12 and 13 are forced to the same voltage. The competition node 11 is driven at the same time or later, by a current that flows through the pnpn-devices in a forward direction; i.e. from anodes to cathodes. The source 7 driving the competition node is preferably a high output impedance current source. To force the voltages at cathode 12 and cathode 13 to a certain voltage, transistor 4 and transistor 6 are driven in such a manner that a high output conductance is achieved. Hereto a high W/L aspect ratio is taken for transistors 4 and 6. When the current source 7 is designed using a PMOS transistor 3, the W/L of transistors 4 and 6 are preferably at least four times larger than the W/L of the current source 7. When an offset to the differential light input is required, the voltages to which the cathodes 12 and 13 are forced should then be chosen different. When no offset is required, it is preferred to force the cathodes to the same wire. In the Example of FIG. 10, the ground rail is the wire to which the cathodes 12 and 13 are pulled by driving transistors 4 and 6. Current in this way is injected in the competition node 11, and extracted at the cathodes 12 and 13.

Figure 3:
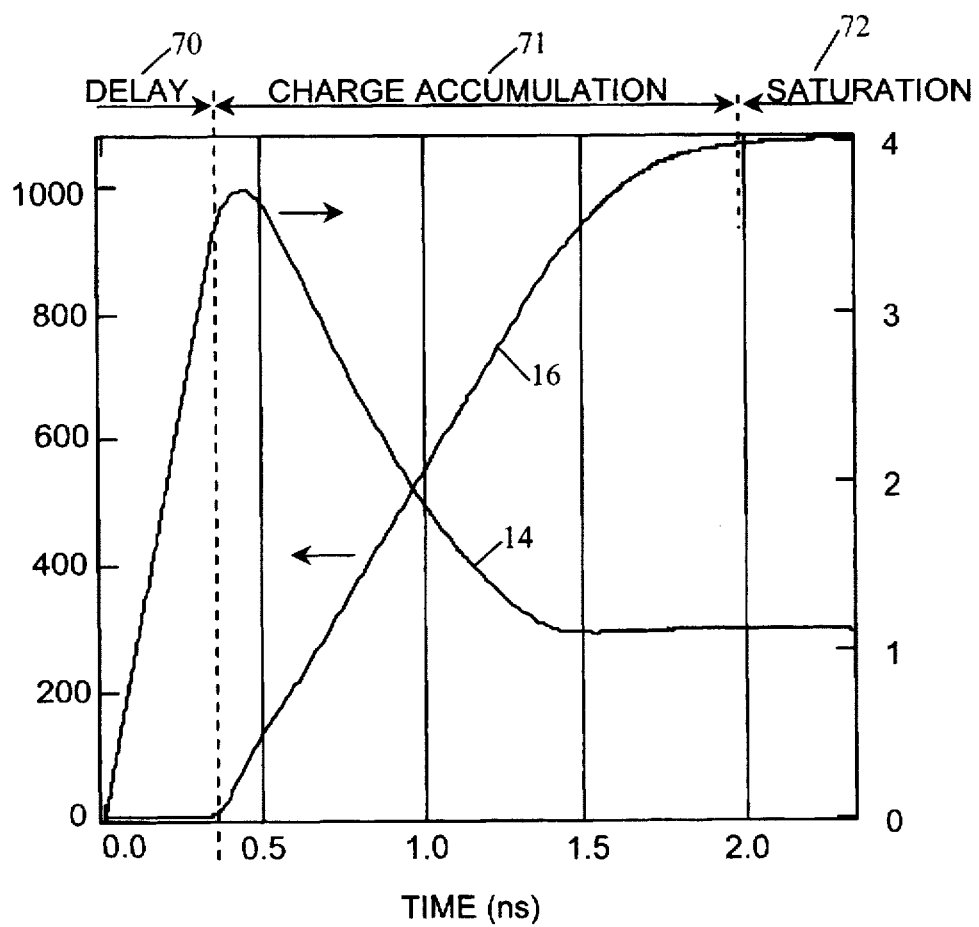
FIG. 3: A graph depicting the anode voltage 14 and the charge content 16 versus time for a single pnpn-device when forward driven by a current source of 500 µA.

To make the special amplification scheme more understandable, some extra information is given on pnpn-devices. Curves 14 and 16 in FIG. 3 are the calculated anode voltage and the internal charge content versus time of one pnpn-device respectively when the device is forward driven by a current source of 500 µA whereby the cathode of the pnpn-device is forced to ground potential. The pnpn-device in the following calculated examples is a four layer structure type according to the teaching of patent application PCT/BE93/00074 comprising a p-layer 500 nm thick doped $10^{18}$ cm$^{-3}$; an n-layer 1000 nm thick doped $5\times10^{15}$ cm$^{-3}$; a p-layer 1000 nm thick doped $5\times10^{15}$; and an n-layer 500 nm thick doped $10^{18}$ cm$^{-3}$. The device area is 30×30 µm$^2$. The layers by preference are made in a III–V semiconductor material.

The voltage of curve 14 shows a rising edge corresponding to a positive capacitance, followed from 0.4 ns on by a falling edge corresponding to a negative differential capacitance, and ending in a constant voltage of about 1.2 V. During the rising edge, there is only a displacement current inside the device. It introduces a delay 70 in the charging current. During the falling edge of curve 14, majority charges from the outer layers cross the outer junctions and accumulate in the two middle layers of the pnpn-device. The sum of all the minority and majority carriers in the middle two layers of the pnpn-structure forms the charge content of the pnpn-device. The driving current is used completely for filling the pnpn-device with charges. The charge content curve 16 increases linearly during this charge accumulation period 71. At the end, the voltage is constant. The device is full, and all the entering charges balance the charges which disappear through recombination. The charge content stops increasing, referred to as saturation 72.

Figure 4:
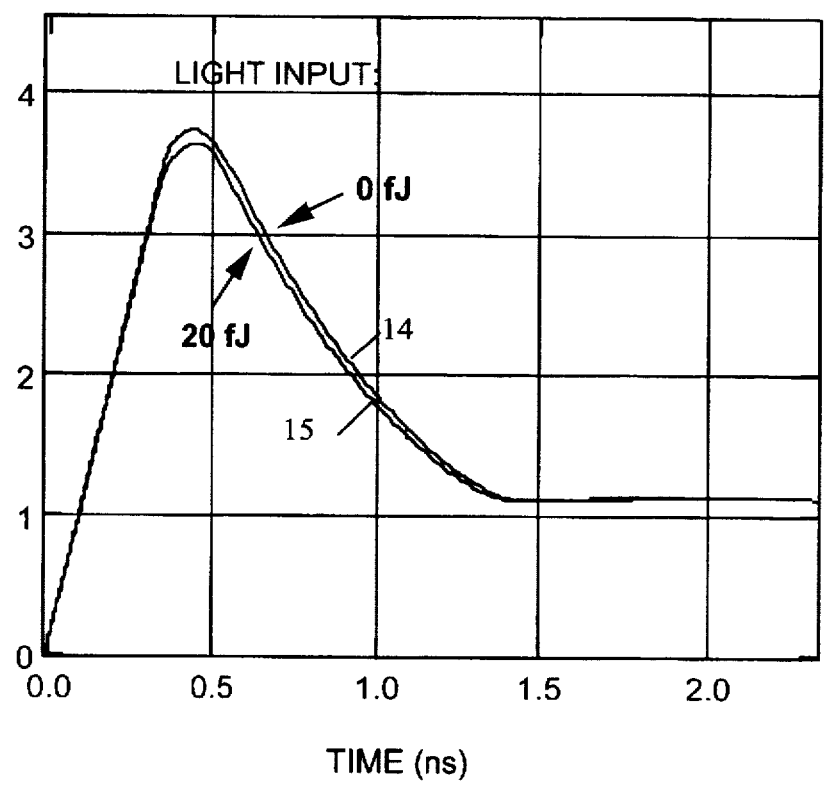
FIG. 4: A graph depicting the anode voltage of a single pnpn-device when forward driven by a current source of 500 µA, under two illumination conditions: no light curve 14 and a light pulse of 20 femtoJoules given shortly before t=0 ns curve 15.

Curve 15 in FIG. 4 differs from curve 14 in that the pnpn-device has been illuminated shortly before the application of the driving current with a light pulse of 20 femtoJoule. In this example it is considered that all the light has been absorbed effectively. One can see that the maximum voltage level reached in curve 15 is slightly lower than for the illuminated device curve 14. The charge accumulation phase 71 sets in earlier than when no light is given.

Figure 5:
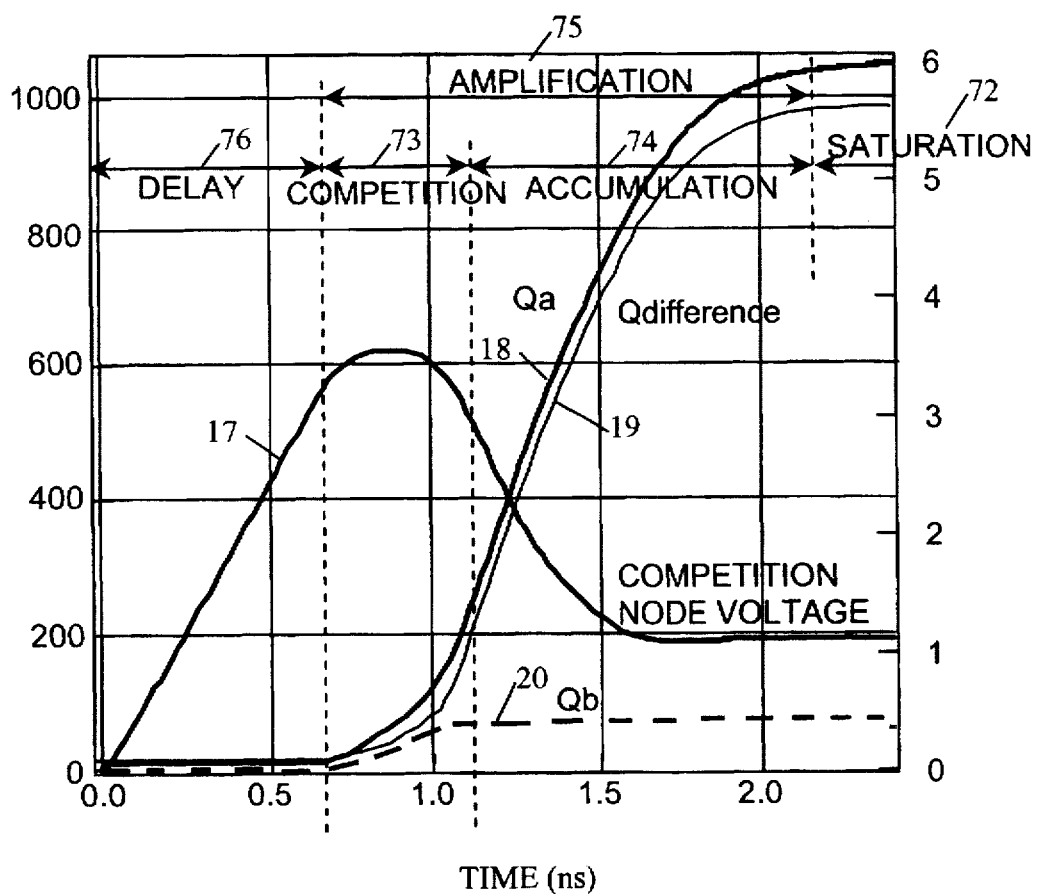
FIG. 5: The voltage 17 on the competition point and the charge content in pnpn-device A and B (curves 18 and 20 respectively) versus time during the delay 76, the differential charge amplification 75 and the start of the saturation period 72 when the differential charge amplification action is practiced on the preferred embodiment of FIG. 2.

FIG. 5 shows results of calculations of two pnpn-devices with the anodes connected together forming the competition node 11, and with cathodes forced to ground potential.

Pnpn-device 1 has initially a higher charge content than pnpn-device 2. The current source initially induces the competition node voltage (curve 17) to increase while the current gets equally divided over the two pnpn-devices. This is indicated in FIG. 5 by the period of delay 76. Pnpn-device 1 puts a limit to the maximum competition node voltage. This occurs at 0.7 ns in the chosen example. From this moment on, pnpn-device 1 draws more from the current injected by the current source than pnpn-device 2. The effect is that pnpn-device 1 will attain more charges, and it forces the competition node voltage to drop. This altogether forms a positive feedback-loop, making the device with the highest charge content always attract more of the available charges, until the charge increase in the other device stops (curve 20 at 1.1 ns in FIG. 5). The combination of these effects happens during the competition period 73. This period is followed by the accumulation period 74 during which pnpn-device 1 shows an essentially linear increase in its charge content (curve 18), while the charge content in pnpn-device 2 remains the same (curve 20). The increase in charge in pnpn-device 1 saturates around 2 ns. Curve 19 is the difference between the charge content in pnpn-device 1 and pnpn-device 2. At time 0 ns, it shows the given precharge difference. During competition, it grows approximately exponentially. During the accumulation period, it increases essentially linearly, with in the end saturation. During the competition period and the accumulation period, the charge content difference is effectively amplified. Therefore these periods form together the amplification period 75. A designer can choose not to wait for the saturation point. If enough amplification is obtained earlier, or if the saturation at the end is unwanted, the amplification period can be stopped somewhere in the middle. Amplification levels of the order of 80 dB or higher can be achieved.

An important design issue is the freedom of the competition node to settle to its own voltage in the amplification process. The node should not be hindered too much by parasitic capacitance or conductance. The latter corresponds with using a current source with a high output impedance. Therefore, one can use a PMOS transistor which is driven with a not too large gate-source voltage. Over a large drain-source voltage domain the PMOS-transistor will be saturated and serve as a good current source. In the example of FIG. 10, the PMOS-transistor 36 is not driven in this way.

Turn-off Read-out Action

The turn-off read-out action is another important objective of this invention. It serves a double purpose, i.e. turn-off and read-out. Turn-off is the process of extracting substantially all charges from the middle two layers from each of the pnpn-devices, such as to increase the light input sensitivity, as described in M. Kuijk et al. "Depleted Double-Heterojunction Optical Thyristor", Appl. Phys. Lett., 1994, vol 64, p. 2073. Read-out is the electrical measurement of the charge content of each of the pnpn-devices separately. The read-out completes the process of light conversion to charges, differential charge amplification, with a step to make the charge information available to electronic circuitry.

It is achieved in the following manner. With the anodes together forming the competition node, and the cathodes driven separately, we have a possibility to turn off the pnpn-devices individually. With two current sources injecting current in the cathodes, the pnpn-devices will be turned off independently. The competition node 11 should be draining the sum of these currents. To this end, node 11 can be pulled low, for example to the ground power rail.

Figure 6:
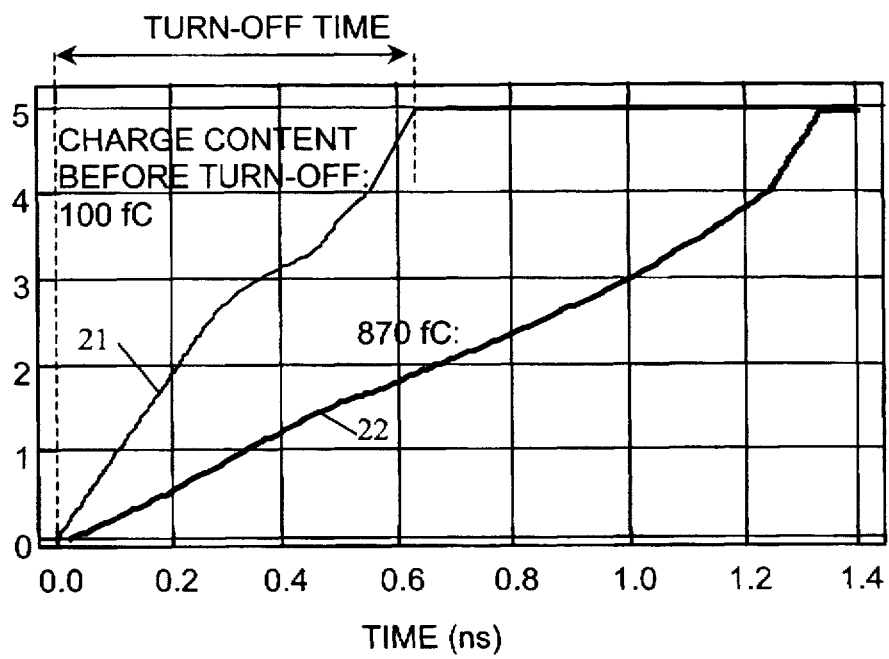
FIG. 6: The voltages on a single pnpn-device versus time when a reverse current of 500 µA is applied for two initial charge conditions.
Figure 7:
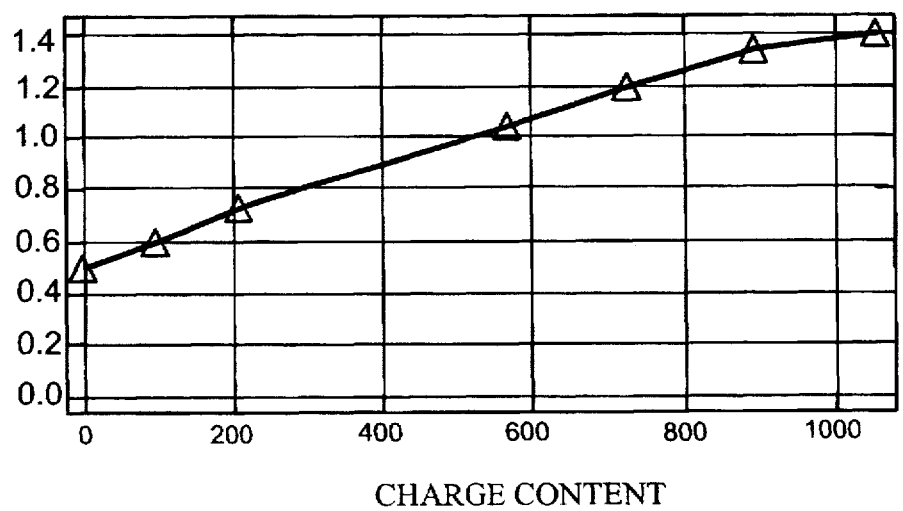
FIG. 7: Turn-off time (23 in FIG. 6) versus the charge content of a single pnpn-device.

When turning off the pnpn-devices individually, it is feasible to measure at the same time the charge content in the respective pnpn-devices. For a better understanding of this process, an explanation of this is included. FIG. 6 shows the turn off behavior of a single pnpn-device with the aforementioned layer structure. Two curves are given: the curve 21 where the two middle layers contain an initial charge of 100 femtoCoulomb, and the curve 22 where the two middle layers contain an initial charge of 870 femtoCoulomb before the start of the turn-off process. The anode is forced to the ground potential, and a current of 500 µA is injected in the cathode. This reverse current will reverse bias the pnpn-device. For this layer structure, all the charges are evacuated when a cathode to anode voltage of 4V is reached. If the current is generated by a current source saturating at 5V, the curves 21 and 22 are obtained. The curves are monotonically increasing, the device with the highest initial charge is the slowest. If the turn-off time is defined as the moment when 5 Volt is reached, the turn-off time versus initial charge content can be drawn (FIG. 7). The curve 24 demonstrates the correspondence between the turn-off time and the initial charge content. With no initial charge the turn-off process is not immediate but takes 500 ps (pico seconds) due to the capacitance of the empty pnpn-device.

Figure 8:
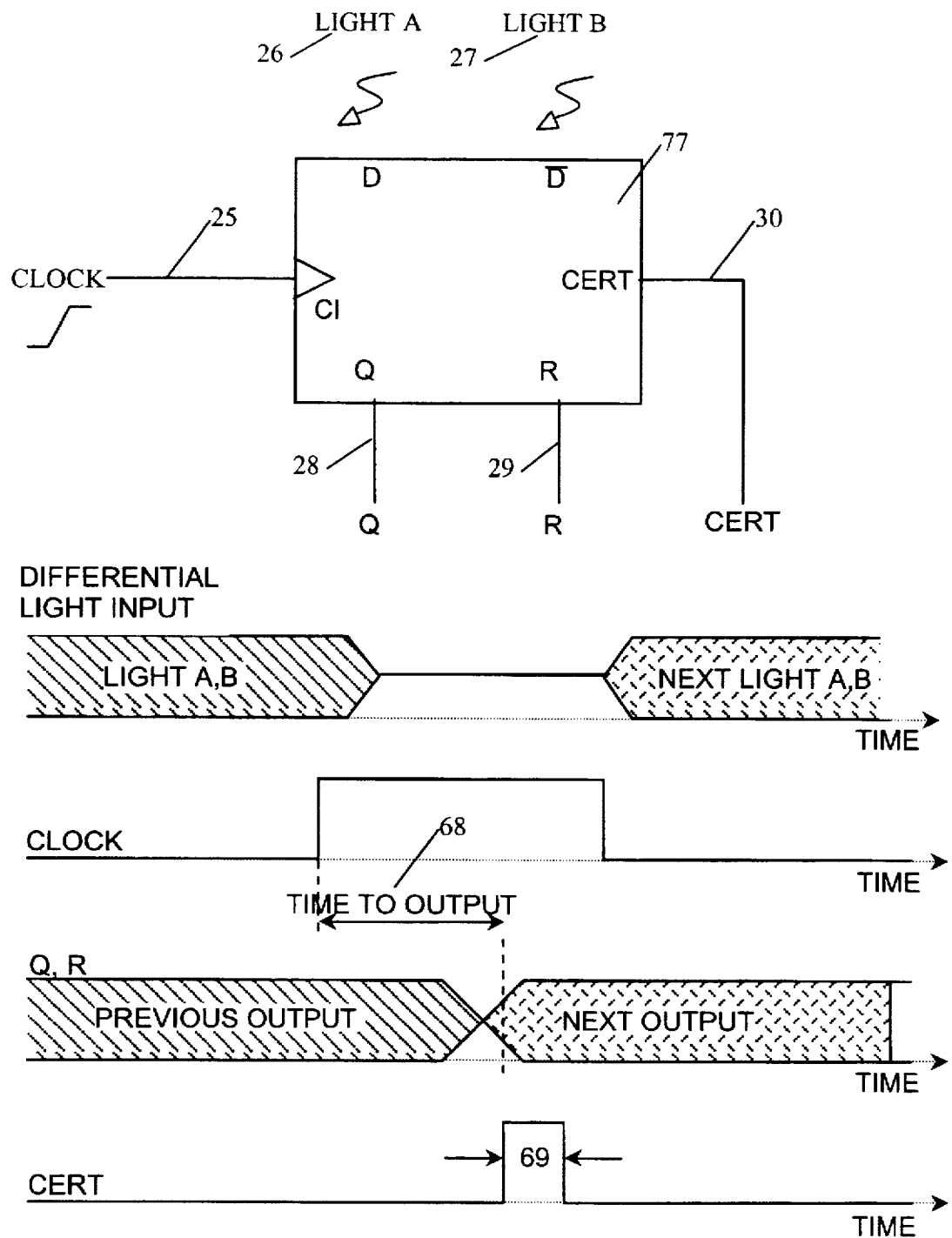
FIG. 8: Example of the preferred embodiment: external optical and electrical connections and the external timing diagram.
Figure 9:
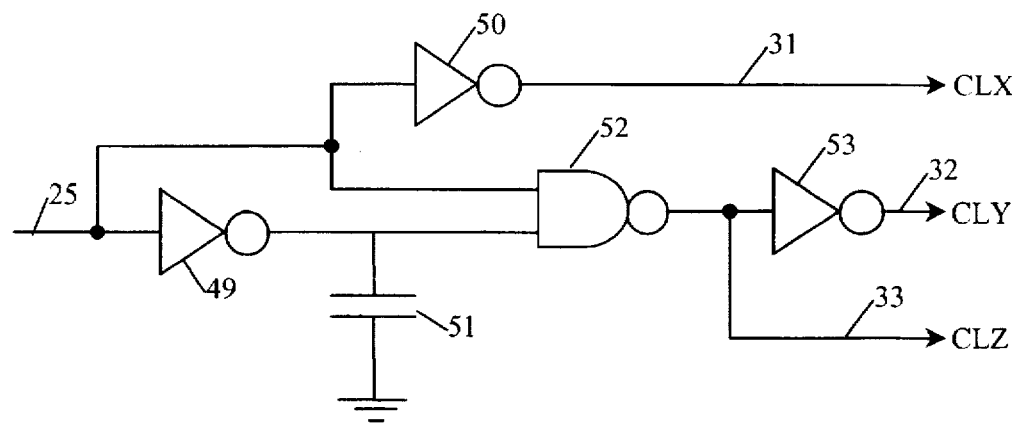
FIGS. 9, 10 and 11 show the internal parts. The system forms a latching comparator for light input and digital output.

In FIG. 2, the turn-off currents are injected at the cathodes by transistors 3 and 5, and extracted at the competition node by transistor 8. A circuit example of the preferred embodiment is given in FIGS. 8 to 11. In this example the period for turn-off is determined by two clock signals CLY 32 and CLX 31 derived from one master clock signal: Clock 25, as shown in FIG. 9. When CLY and CLX are low at the same time, two PMOS transistors 3 and 34 are placed in series to generate the turn-off current of pnpn-device 1 and two POS transistors 5 and 35 are placed in series to generate the turn-off current of pnpn-device 2. When CLZ 33 is high, transistor 8 ties the voltage of the competition node 11 to the ground potential. This combination allows the turn-off read-out to take place.

Voltage Reset Action

The voltage-reset action has to take place after the turn-off read-out action, and before the pnpn-devices are expected to be sensitive to incident light. After the turn-off read-out action, a maximal negative anode to cathode voltage is present across the pnpn-devices. Light-generated charges will, like all other charges, be extracted immediately, and are thus ineffective. To render the pnpn-devices light-sensitive again it is sufficient to reduce the reverse bias across the pnpn-devices by one or more volts.

This can be achieved by using the already present forward drive capacity of the transistors 4, 6 and the current source 7 (in FIG. 2) or the transistor 36 (in FIG. 10). If the forward drive is exercised during a period sufficiently long to reduce the reverse bias across the pnpn-devices by a few volts, and sufficiently brief such as not to start the differential charge amplification process, then one has achieved a good voltage-reset action.

FIG. 2 shows other means to achieve the voltage reset action. During the light-sensitive period the voltage across the pnpn-devices is brought to essentially 0V by short-circuiting the competition node 11 and the cathodes 12 and 13 using switches 9 and 10. In the example using the preferred embodiment of FIG. 10, NMOS pass-transistors 37 and 38 induce this effect. Light generated charges can then be collected in the two middle layers of the pnpn-devices without being extracted.

An overall method comprises the three actions in the following sequence: voltage-reset; differential charge amplification; turn-off read-out.

A complete example is given by the system of FIG. 8, described as follows: a latched comparator with differential light inputs 26 and 27, an electrical clock signal 25, two complementary digital electrical outputs 28 and 29 and a pulsed output 30 where the pulse width provides a measure of the difference in light input. The lower portion of FIG. 8 shows the timing diagram. When the clock signal 25 exhibits a positive edge, the differential accumulated light input 26 and 27 is converted in a digital output Q 28 and its inverse R 29 after a certain time-to-output time 68. More light input 26 on pnpn-device 1 than light input 27 on pnpn-device 2 gives a high state on output Q 28, and a low state on output R 29. Conversely, more light input 27 on pnpn-device 2 than light input 26 on pnpn-device 1 gives a low state on output Q 28, and a high state on output R 29. An extra output gives a pulse at the moment of reception with a width corresponding to the certitude of the reception. The larger the difference between the two light inputs is, the longer the pulse width at the CERT 30 output will be. The CERT signal is important for dual rail optical links were the error probability is important data. For a receiver in combination with a phase locked loop, this information is also required as a feedback signal to adjust the phase. One can provide light input at the moment when the pnpn-devices are sensitive. The total light difference accumulated during this sensitive period is a key-factor in the construction of the digital output.

Figure 12:
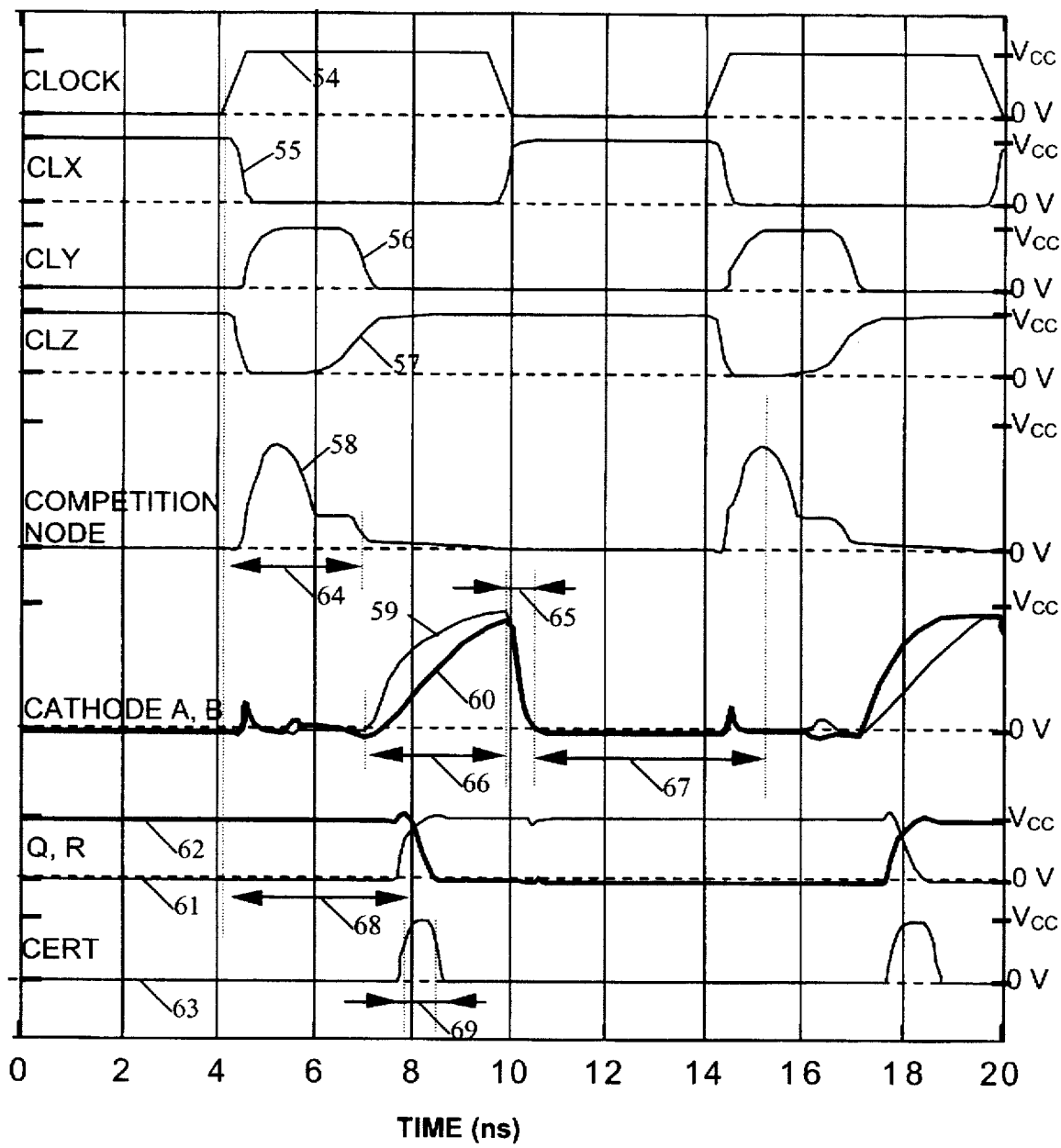
FIG. 12: Voltages on the input, the internal nodes and the outputs versus time for the example of FIG. 8.

FIG. 9 shows the derivation of the internal clock-signals CLX 31, CLY 32 and CLZ 33 from the master CLOCK 25. CLX 31 is a delayed inverse of CLOCK 25; CLY 32 is the result of a one-shot action triggered by the positive flank of the clock signal, generated by inventors 49 and 53, the NAND gate 52 and the capacitor 51. CLZ 33 is the inverse of CLY 32. FIG. 12 presents the different results as simulated by SPICE. The clock signals are given by curves 54 to 57.

Figure 11:
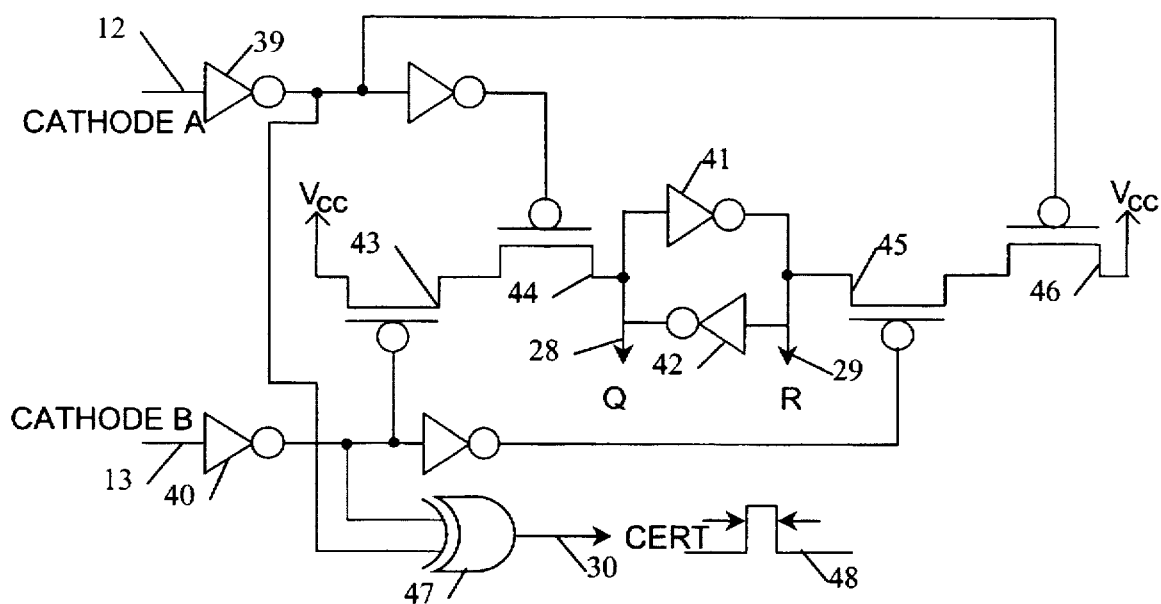

FIG. 10 shows the couple of pnpn-devices with the competition node formed by their anodes. For the forward drive used in the differential charge amplification, the transistors 4, 6 and 36 are used. For the turn-off read-out action, transistors 3, 34, 5, 35 and 8 are used. Transistors 37 and 38 are provided for the voltage reset action. The pnpn-devices have the aforementioned layer structure and area. To derive the useful digital outputs and the CERT-output, the CMOS flip-flop of FIG. 11 is used. If during the turn-off read-out action cathode 13 rises faster than cathode 12, then PMOS transistors 43 and 44 will conduct whereas transistors 45 and 46 will remain off. Conversely, if cathode 12 rises faster, then PMOS 45 and 46 will conduct. The latching duo of invertors 41 and 42 will hereby be flipped if the new result is different from the preceding result. The outputs of these invertors are the general outputs Q 28 and R 29. The larger the charge difference in the pnpn-devices, the longer the duration between the turn off edges, and the longer the outputs of the invertors 39 and 40 will be different. The latter signals feed the EXOR 47, which is designed to show a high output level during the period that the turn off edges are out of phase. The resulting output CERT 30 is hence a measure for the amplitude of the different charge in the pnpn-devices after amplification.

In FIG. 12 several features can be seen by voltages versus time for two cycles of light reception at a 100 MHZ rate. Curve 58 gives the competition node voltage. Period 64 corresponds to the differential charge amplification action. Curves 59 and 60 give the cathode voltages on which the turn-off read-out action can be seen clearly during the period 66. Period 65 is where the voltage across the pnpn-devices are reset to zero by the voltage reset action. Thereafter the pnpn-devices are light sensitive again during the period 67. This period lasts until the negative differential capacitance occurs in the next differential amplification action. Curves 61 and 62 are the complementary outputs Q28 and R29. The new output is valid after the active edge of the clock, with a latency time-to-output 68. Curve 63 gives the CERT 30 signal, with the pulse width indicated by 69.

In the example as described here-above and using pnpn-devices with the aforementioned layer structure and device area, the system can have a sensitivity as low as 2 femtoJoule. There is no indication that a lower sensitivity can not be achieved, and sensitivities lower than 0.1 femtoJoule or lower than 0.01 femtoJoule are feasible with the detection system of the present invention. In the example as described here-above and using pnpn-devices with the aforementioned layer structure and device area, the system can have a cycle speed or bit rate detection between 1 kHz and 100 MHZ. There is no indication that a higher detection rate can not be achieved, said rate being highly dependent on the semiconductor technology in which the driving circuits are integrated. For instance a detection rate up to 10 GHz is feasible with the detection system of the present invention.

We claim:

1. An optoelectronic cell for light conversion and amplification comprising:
    a plurality of circuits, each of said circuits including:
    a device with S-shaped current-voltage characteristics and having a first and a second terminal;
    means for applying an injection current and an extraction current on said device, said means for applying being connected to said first terminal of said device; and
    essentially each of said circuits being connected at a competition node connecting essentially each of said second terminals of the devices.

2. The optoelectronic cell as recited in claim 1, further comprising a current source being connected to said competition node.

3. The optoelectronic cell as recited in claim 1, wherein said means for applying comprise a first and a second transistor, said first transistor applying said injection current on said device, and said second transistor applying said extraction current on said device.

4. The optoelectronic cell as recited in claim 3, wherein said first transistor is the complement of said second transistor.

5. The optoelectronic cell as recited in claim 1, further comprising means for reducing the voltage over said device.

6. The optoelectronic cell as recited in claim 5, wherein said means for reducing the voltage over said device is a switch.

7. The optoelectronic cell as recited in claim 6, wherein said switch is a pass transistor.

8. The optoelectronic cell as recited in claim 1, wherein said devices are pnpn-devices.

9. The optoelectronic cell as recited in claim 8, wherein said pnpn-devices are optical thyristors.

10. An optolectronic cell for light conversion and amplification, comprising: a plurality of circuits, each of said circuits including:
    a device with S-shaped current-voltage characteristics and having a first and a second terminal;
    means for applying a current on said device, said means being connected to said first terminal of said device;
    means for applying a voltage on said first terminal of said device; and
    essentially each of said circuits being connected at a competition node connecting essentially each of the second terminals of the devices.

11. The optoelectronic cell as recited in claim 10, further comprising a current source being connected to said competition node.

12. The optoelectronic cell as recited in claim 10, wherein said means for applying a current on said device comprise a first transistor, and said means for applying a voltage on said device comprise a second transistor.

13. The optoelectronic cell as recited in claim 12, wherein said second transistor is driven into a high output conductance.

14. The optoelectronic cell as recited in claim 10, further comprising means for reducing the voltage over said device.

15. The optoelectronic cell as recited in claim 14, wherein said means for reducing the voltage over said device is a switch.

16. The optoelectronic cell as recited in claim 15, wherein said switch is a pass transistor.

17. The optoelectronic cell as recited in claim 10, wherein said devices are pnpn-devices.

18. The optoelectronic cell as recited in claim 17, wherein said pnpn-devices are optical thyristors.

19. A method for differentially amplifying charges being present in a system with a plurality of devices having S-shaped current-voltage characteristics, said devices having a first and a second terminal, said second terminals being interconnected at a competition node connecting essentially each of said second terminals of said devices, said method comprising the steps of:

fixing the voltages of said first terminals of said devices at a voltage being essentially identical for each of said devices; and driving said competition node with a current for a period of time, said period of time and said current determining the amplification factor.

20. The method as recited in claim 19, wherein said competition node is driven with a high output impedance current source.

21. The method as recited in claim 19, wherein said voltage on said first terminals is fixed using a plurality of transistors being driven into a state with a high output conductance.

22. The method as recited in claim 19, wherein a light input is acquired in said devices, said light input being different for said devices.

23. The method of claim 19, wherein said voltages on said first terminals is fixed by transistors connected between each of said first terminals and a reference voltage.

24. The method of claim 19, wherein said devices are pnpn devices.

25. The method of claim 24, wherein said pnpn devices are optical thyristors.

26. A method for substantially simultaneously turning off a plurality of devices with S-shaped current-voltage characteristics and reading out the charge contents present in said devices, said devices having a first and a second terminal, said second terminals being interconnected at a competition node connecting essentially each of said second terminals of said devices, comprising the steps of:

driving said first terminals of said devices by first currents, thereby extracting the charge contents of said devices;

driving said competition node with a second current, being essentially equal to the sum of said first currents;

measuring the voltages on said first terminals of said devices, the measured evolution of said voltages being dependent on said charge contents.

27. The method of claim 26, wherein voltages on said first terminals are measured by at least one exclusive-or gate.

28. The method of claim 26, wherein a logic gate outputs a first predetermined logic value when the difference between said voltages on said first terminals exceeds a predetermined threshold, and outputs a second predetermined logic value when the difference between said voltages does not exceed said predetermined threshold.

29. The method of claim 26, wherein said plurality of devices comprises two such devices.

30. The method of claim 29 further comprising the steps of:

determining which of said first terminals has a higher voltage; and, storing one of two predetermined logic values in response to said determination.

31. The method of claim 26 further comprising the steps of:

determining which of said first terminals has a higher voltage; and, providing a signal representative of which of said first terminals has a higher voltage.

32. A method for lowering the voltage across a plurality of devices with S-shaped current-voltage characteristics, said devices having a first and a second terminal, said second terminal being connected at a competition node connecting essentially each of said second terminals of said devices, comprising the steps of:

fixing the voltages of said first terminals of said devices at a voltage being essentially identical for each of said devices;

driving said competition node with a current for a first period of time, said first period of time and said current determining the amplification factor; and thereafter driving said competition node with a current for a second period of time, said second period of time being sufficiently brief to yield essentially no differential amplification.

33. A method of lowering the voltage across plurality of devices with S-shaped current-voltage characteristics, said devices having a first and a second terminal and first means for applying an injection current and an extraction current on said devices and second means for reducing the voltage over said devices, said second terminal being connected at a competition node connecting essentially each of said second terminals of said devices, said method comprising the steps of:

fixing the voltages of said first terminals of said devices at a voltage being essentially identical for each of said devices; and short-circuiting said competition node and said first terminals.

34. In a detection system with a plurality of devices with S-shaped current-voltage characteristics, said devices having a first and a second terminal, said second terminals being interconnected at a competition node connecting essentially each of said second terminals of said devices, a method for converting a differential light input in said detection system in a voltage output pulse, the pulse width being a measure for the differential light input, said method comprising the steps of:

fixing the voltages of said first terminals of said devices at a voltage being essentially identical for each of said devices;

driving said competition node with a current for a period of time, said period of time and said current determining the amplification factor;

driving said first terminals of said devices by first currents, thereby extracting the charge contents of said devices;

driving said competition node with a second current, being essentially equal to the sum of said first currents;

measuring the voltages on said first terminals of said devices, the measured evolution of said voltages being dependent on said charge contents.

35. The method as recited in claim 34, further comprising the step of:

lowering the voltage across a plurality of devices with S-shaped current-voltage characteristics.

36. The method of claim 35, wherein the step of lowering the voltage further comprises the steps of:

fixing the voltages of said first terminals of said devices at a voltage being essentially identical for each of said devices;

driving said competition node with a current for a first period of time, said first period of time and said current determining the amplification factor; and thereafter driving said competition node with a current for a second period of time, said second period of time being sufficiently brief to yield essentially no differential amplification.

* * * * *